US 9,223,923 B2

(12) United States Patent
Amundson et al.

(10) Patent No.: US 9,223,923 B2
(45) Date of Patent: *Dec. 29, 2015

(54) IMPLEMENTING ENHANCED PHYSICAL DESIGN QUALITY USING HISTORICAL PLACEMENT ANALYTICS

(71) Applicant: International Business Machines Corporation, Armonk, NY (US)

(72) Inventors: Michael D. Amundson, Oronoco, MN (US); Joel R. Earl, Rochester, MN (US); Timothy D. Helvey, Rochester, MN (US); David A. Lawson, Rochester, MN (US); Michael T. Repede, Rochester, MN (US)

(73) Assignee: International Business Machnes Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/291,219

(22) Filed: May 30, 2014

(65) Prior Publication Data
US 2015/0205900 A1    Jul. 23, 2015

Related U.S. Application Data

(63) Continuation of application No. 14/162,304, filed on Jan. 23, 2014.

(51) Int. Cl.
*G06F 17/50* (2006.01)
(52) U.S. Cl.
CPC ........ *G06F 17/5072* (2013.01); *G06F 17/5081* (2013.01)

(58) Field of Classification Search
None
See application file for complete search history.

(56) References Cited

U.S. PATENT DOCUMENTS

| | | | | | |
|---|---|---|---|---|---|
| 5,237,514 | A | * | 8/1993 | Curtin | 716/113 |
| 5,875,117 | A | | 2/1999 | Jones et al. | |
| 6,360,191 | B1 | * | 3/2002 | Koza et al. | 703/6 |
| 6,493,658 | B1 | | 12/2002 | Koford et al. | |
| 7,024,645 | B2 | * | 4/2006 | Sumikawa | 716/108 |
| 7,594,208 | B1 | * | 9/2009 | Borer et al. | 716/132 |
| 7,681,165 | B2 | * | 3/2010 | Peters et al. | 716/119 |
| 7,788,614 | B1 | * | 8/2010 | Galloway et al. | 716/113 |
| 7,904,848 | B2 | * | 3/2011 | Coene et al. | 716/126 |
| 8,074,189 | B2 | * | 12/2011 | McConaghy et al. | 716/100 |
| 2006/0080628 | A1 | | 4/2006 | Enomoto et al. | |
| 2011/0041104 | A1 | | 2/2011 | Izuha et al. | |

FOREIGN PATENT DOCUMENTS

| | | |
|---|---|---|
| JP | 2004213510 A1 | 7/2004 |
| JP | 2004258836 A1 | 9/2004 |

OTHER PUBLICATIONS

Ed Maste, "Efficient Hierarchical Algorithm for Mixed Mode Placement in Three Dimensional Integrated Circuit Chip Designs" Tsinghua Science and Technology, vol. 14(2), 2009 , pp. 161-169.

* cited by examiner

*Primary Examiner* — Leigh Garbowski
(74) *Attorney, Agent, or Firm* — Joan Pennington

(57) ABSTRACT

A method and apparatus are provided for implementing enhanced physical design quality using historical placement analytics in a design of an integrated gate. Mathematical data analysis is performed to determine placement trends in order to seed an initial placement of subsequent physical design placement processes. A placement seed is generated for a subsequent placement process.

9 Claims, 9 Drawing Sheets

300

| VARIATION DATA 140 ||||| 
|---|---|---|---|---|
| GATE ID 302 | HISTORICAL PLACEMENT LOCATIONS 304 | WEIGHT 306 | HISTORICAL TIMING 308 | HISTORICAL CONGESTION 310 |
| GATE A | (1,3) (4,5) (2,3) | 1, 1, -2 | 10, 5, -10 | 78, 75, 85 |
| GATE B | (2,3) (1,1) (1,2) | 2, 1, 1 | 2, 4, 6 | 75, 78, 76 |
| GATE C | (1,2) (2,2) (1,1) | 1, -3, 2 | 8, -25, 5 | 74, 78, 77 |
| GATE D | (1,1) (5,1) (3,1) | 4, 1, 1 | 4, 1, 2 | 72, 76, 76 |

| PLACEMENT SEED 146 | | |
|---|---|---|
| GATE ID 402 | WEIGHTED AVERAGE LOCATION 404 | UNDESIRABLE LOCATIONS 406 |
| GATE A | (2.5, 4) | (2,3) |
| GATE B | (1.5, 2.25) | |
| GATE C | (1, 1.33) | (2,2) |
| GATE D | (2,1) | |

FIG. 4

IMPLEMENTING ENHANCED PHYSICAL DESIGN QUALITY USING HISTORICAL PLACEMENT ANALYTICS

This application is a continuation application of Ser. No. 14/162,304 filed Jan. 23, 2014.

FIELD OF THE INVENTION

The present invention relates generally to the data processing field, and more particularly, relates to method and apparatus for implementing enhanced physical design quality using historical placement analytics.

DESCRIPTION OF THE RELATED ART

Electronic design automation (EDA) physical design placement tools typically process a new netlist from scratch. There may be certain settings the designer has learned over time that can be applied to produce a better, or more stable solution. This learning generally relates to the type of optimizations to perform, specific pre-placement of gates, and/or global settings for large groups of gates.

For example, the designer may force a large group of gates to reside in one region of the design to avoid a particular problem. The designer might also assign a pre-placement for a specific gate based on previous knowledge or simple intuition. These methods are generally manually-intensive and somewhat anecdotal in nature, involving human opinion and potential error. Also, such pre-placements or placement guides tend to be coarse and not fine-tuned to the requirements of particular gates. Many times these decisions are made early in the design process and not revisited later. This approach can tend to limit or box-in optimization tools to produce a less than ideal solution.

A need exists for an efficient and effective method and apparatus for implementing enhanced physical design quality.

SUMMARY OF THE INVENTION

Principal aspects of the present invention are to provide a method and apparatus for implementing enhanced physical design quality using historical placement analytics. Other important aspects of the present invention are to provide such method and apparatus substantially without negative effects and that overcome many of the disadvantages of prior art arrangements.

In brief, a method and apparatus are provided for implementing enhanced physical design quality using historical placement analytics in a design of an integrated gate. Mathematical data analysis is performed to determine placement trends in order to seed an initial placement of subsequent physical design placement processes. A placement seed is generated for a subsequent placement process.

In accordance with features of the invention, the mathematical data analysis takes into account a history of the design in order to determine the best location for a particular gate or group of gates.

In accordance with features of the invention, generating a placement seed used for a subsequent placement process includes identifying a weighted average location and any undesirable location for a gate or group of gates.

In accordance with features of the invention, the mathematical data analysis uses multiple metrics, for example, placement, timing, and congestion from a plurality of variations of a design.

BRIEF DESCRIPTION OF THE DRAWINGS

The present invention together with the above and other objects and advantages may best be understood from the following detailed description of the preferred embodiments of the invention illustrated in the drawings, wherein:

FIG. 3 is a block diagram illustrating example processing for example variation data generated in accordance with the preferred embodiment;

FIG. 4 is a block diagram illustrating example processing for an example placement seed generated in accordance with the preferred embodiment;

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing enhanced physical design quality using historical placement analytics.

Figure 1:
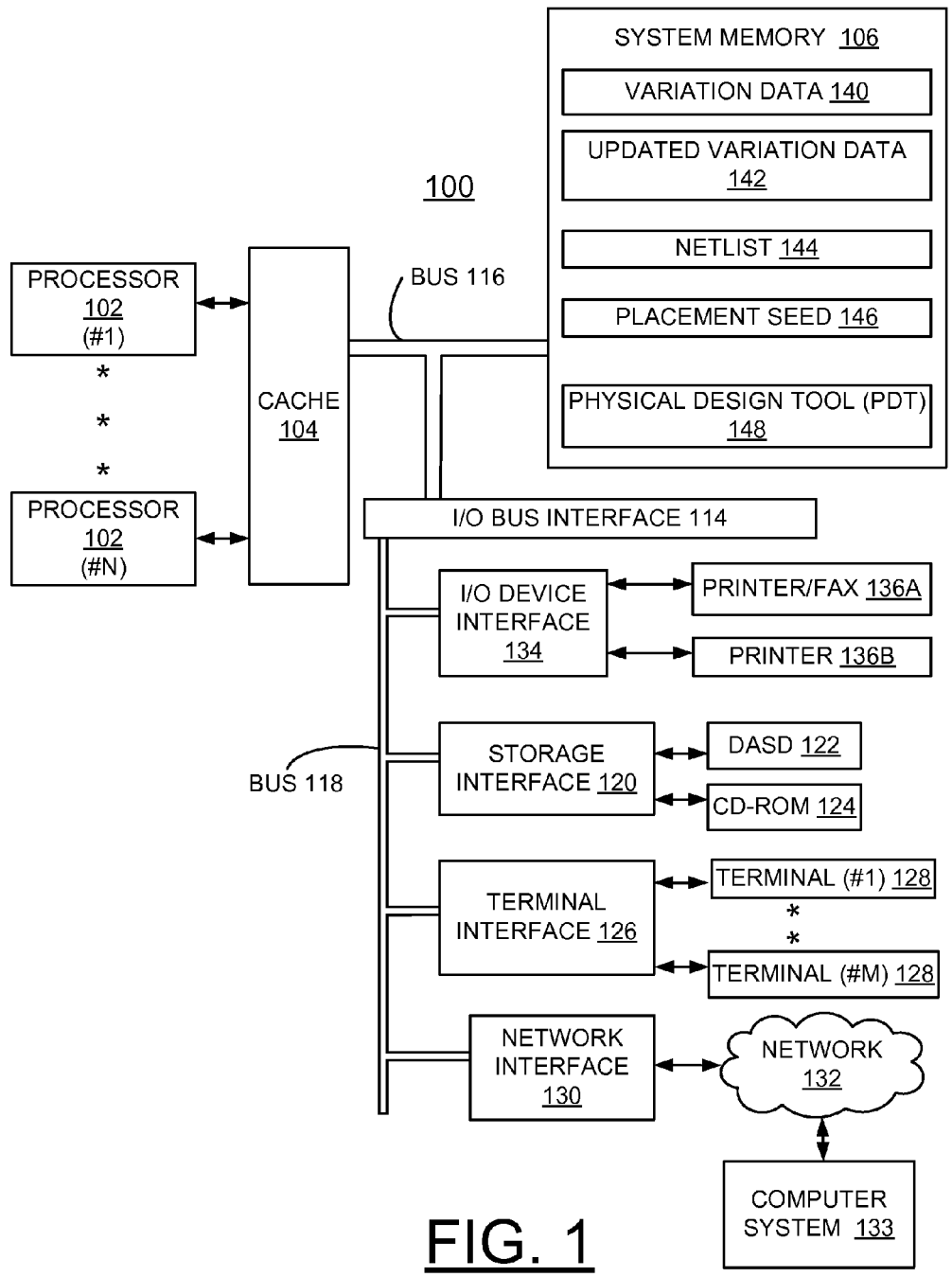
FIG. 1 is a block diagram of an example computer system for implementing enhanced physical design quality using historical placement analytics in accordance with the preferred embodiment.

Having reference now to the drawings, in FIG. 1, there is shown a computer system embodying the present invention generally designated by the reference character 100 for implementing enhanced physical design quality using historical placement analytics, in accordance with the preferred embodiment. Computer system 100 includes one or more processors 102 or general-purpose programmable central processing units (CPUs) 102, #1-N. As shown, computer system 100 includes multiple processors 102 typical of a relatively large system; however, system 100 can include a single CPU 102. Computer system 100 includes a cache memory 104 connected to each processor 102.

Computer system 100 includes a system memory 106. System memory 106 is a random-access semiconductor memory for storing data, including programs. System memory 106 is comprised of, for example, a dynamic random access memory (DRAM), a synchronous direct random access memory (SDRAM), a current double data rate (DDRx) SDRAM, non-volatile memory, optical storage, and other storage devices.

I/O bus interface 114, and buses 116, 118 provide communication paths among the various system components. Bus 116 is a processor/memory bus, often referred to as front-side bus, providing a data communication path for transferring data among CPUs 102 and caches 104, system memory 106 and I/O bus interface unit 114. I/O bus interface 114 is further coupled to system I/O bus 118 for transferring data to and from various I/O units.

As shown, computer system 100 includes a storage interface 120 coupled to storage devices, such as, a direct access storage device (DASD) 122, and a CD-ROM 124. Computer system 100 includes a terminal interface 126 coupled to a plurality of terminals 128, #1-M, a network interface 130 coupled to a network 132, such as the Internet, local area or other networks, shown connected to another separate computer system 133, and a I/O device interface 134 coupled to I/O devices, such as a first printer/fax 136A, and a second printer 136B.

I/O bus interface 114 communicates with multiple I/O interface units 120, 126, 130, 134, which are also known as I/O processors (IOPs) or I/O adapters (IOAs), through system I/O bus 116. System I/O bus 116 is, for example, an industry standard PCI bus, or other appropriate bus technology.

System memory 106 stores variation data 140, updated variation data 142, a netlist 144, a placement seed 146, and a physical design tool (PDT) 148 for implementing enhanced physical design quality using historical placement analytics, in accordance with the preferred embodiment.

Computer system 100 is shown in simplified form sufficient for understanding the present invention. The illustrated computer system 100 is not intended to imply architectural or functional limitations. The present invention can be used with various hardware implementations and systems and various other internal hardware devices.

Various commercially available computers can be used for computer system 100. Processor or CPU 102 is suitably programmed by the physical design tool (PDT) 148 to execute the flowcharts of FIGS. 5A, 5B, 6 and 7 for implementing enhanced physical design quality using historical placement analytics in accordance with the preferred embodiments.

In accordance with features of the invention, data analytics are used to determine placement trends in order to seed initial placement of subsequent physical design placement processes. This approach takes into account a history of a design in order to determine the best location for a particular gate or group of gates. The analysis advantageously considers how several metrics have changed over time, such as placement, timing, congestion, and the like, in order to produce a weighted average. Also this method uses mathematical data analysis and is immune to human error.

Figure 2:
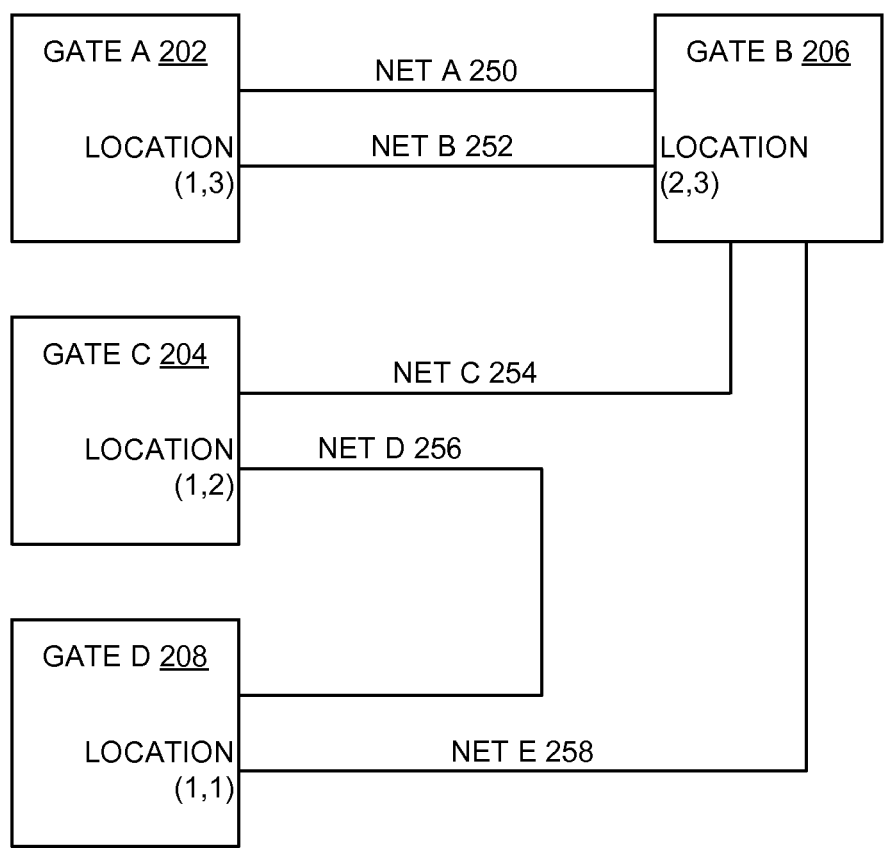
FIG. 2 is a block diagram illustrating example processing for an example netlist with example gates and example connecting nets in accordance with the preferred embodiment.

Referring to FIG. 2, there are shown example processing generally designated by the reference character 200 for an example netlist 144 generated in accordance with the preferred embodiment and stored in memory 106 of the system 100.

As shown in the example processing 200 of FIG. 2, netlist 144 includes example gates including gate A, 202, gate B, 206, gate C, 204, and gate D, 208 in accordance with the preferred embodiment. Netlist 144 includes example connecting nets including Net A, 250 and Net B connecting between gate A, 202, and gate B, 206, Net C, 254 connecting between gate B, 206, and gate C, 204, Net D, 256 connecting between gate C, 204, and gate D, 208, and Net E, 258 connecting between gate B, 206, and gate D, 208 in accordance with the preferred embodiment.

Referring to FIG. 3, there are shown example processing generally designated by the reference character 300 for example variation data 140 generated in accordance with the preferred embodiment and stored in memory 106 of the system 100. As shown in the example processing 300 of FIG. 3, variation data 140 includes a gate ID 302, historical placement locations 304, weight 306, historical timing 308, and historical congestion 310 with examples of each for gate A, gate B, gate C, and gate D. For the purpose of this example it is to be understood that a lower historical timing value 308 implies a worse result than a higher timing value. Conversely, a higher historical congestion 310 implies a worse result than a lower congestion value.

Referring to FIG. 4, there are shown example processing generally designated by the reference character 400 for example placement seed 146 generated in accordance with the preferred embodiment. As shown in the example processing 400 of FIG. 4, example placement seed 146 includes gate ID 402, weighted average location 404 and undesirable locations 406 with examples of each for gate A, gate B, gate C, and gate D.

Example processing 400 for generating placement seed 146 generally works by importing placement and other metrics, for example, placement, timing, congestion from N variations of a design and then analyzing the results to produce an output pre-placement seed 146 for a subsequent placement run. The N variations could be placement jobs executed in parallel with different settings, a history of previous jobs, designer hints, or a combination of all. The example placement seed 146 illustrates a basic implementation that advantageously uses a simple arithmetic placement mean to seed the next run. For example, a list of gates to analyze could be limited to latching elements since combinatorial logic naturally flows toward the latches and it is best to still give the placement tool some freedom.

In accordance with features of the invention, a limitation with the basic implementation is that one or more of the variations may have a very bad placement which causes the placement seed to shift in an undesirable direction. Therefore the algorithm advantageously is modified to only generate averages for latches whose placement is always within some radius of the mean. This approach could be further modified to only produce averages if some percentage of the variations are within some radius of the mean. For example, consider 5 variations of a latch of which 4 variations have placement close to the mean and 1 variation has placement very far from the mean. Since 80% of the variations are within some predefined radius a pre-placement could be generated for this latch. The mean advantageously is further modified to eliminate the outlier.

In accordance with features of the invention, another variation could also be used to produce a list of undesirable locations or regions, for example, as illustrated in placement seed 146 in FIG. 4. For example, consider 5 variations of a latch of which 3 variations placed the latch in a region which resulted in very poor results. Assume the other 2 variations placed the latch in other regions and resulted in acceptable results. The algorithm could be used to generate the undesirable region in addition to desirable regions. Such undesirable regions are shown in 406.

Figure 5A:
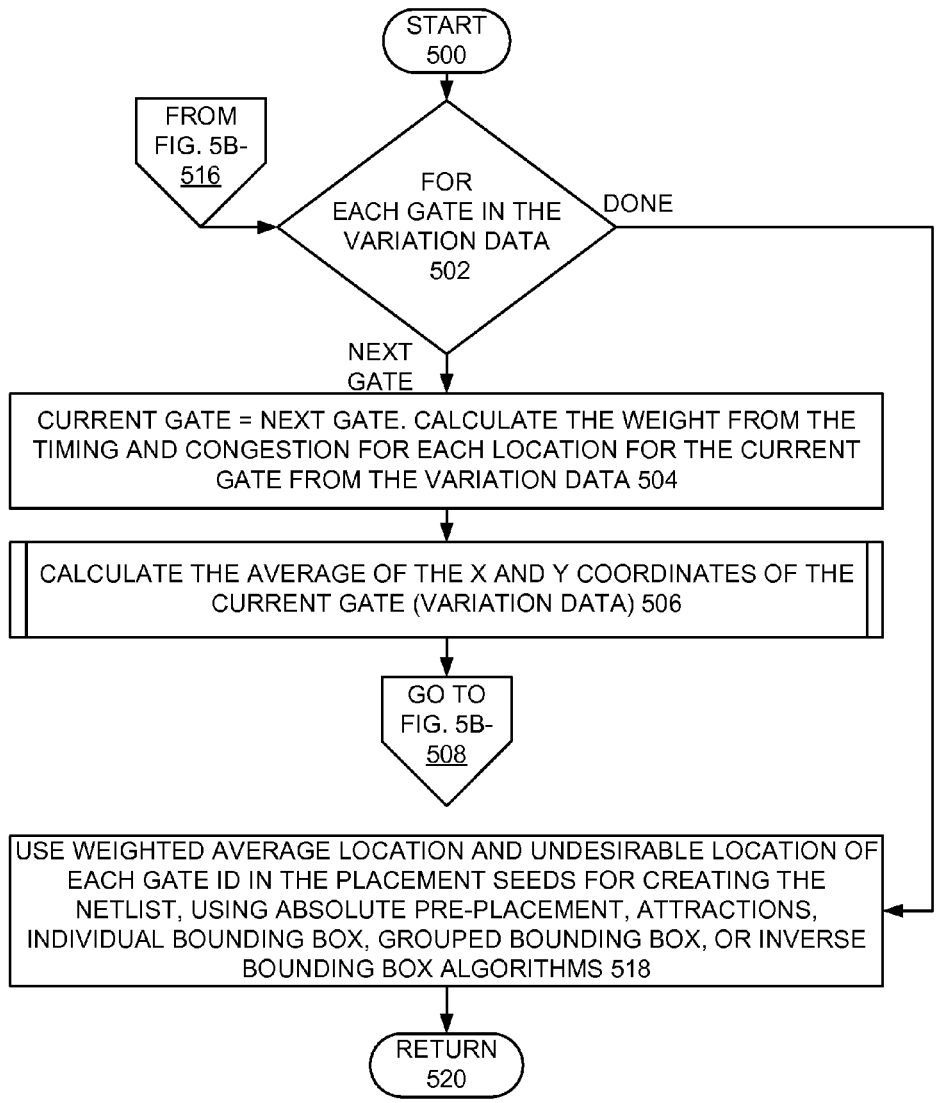
FIGS. 5A and 5B, 6, and 7 are flow charts illustrating example operations for implementing enhanced physical design quality using historical placement analytics in accordance with the preferred embodiment.
Figure 5B:
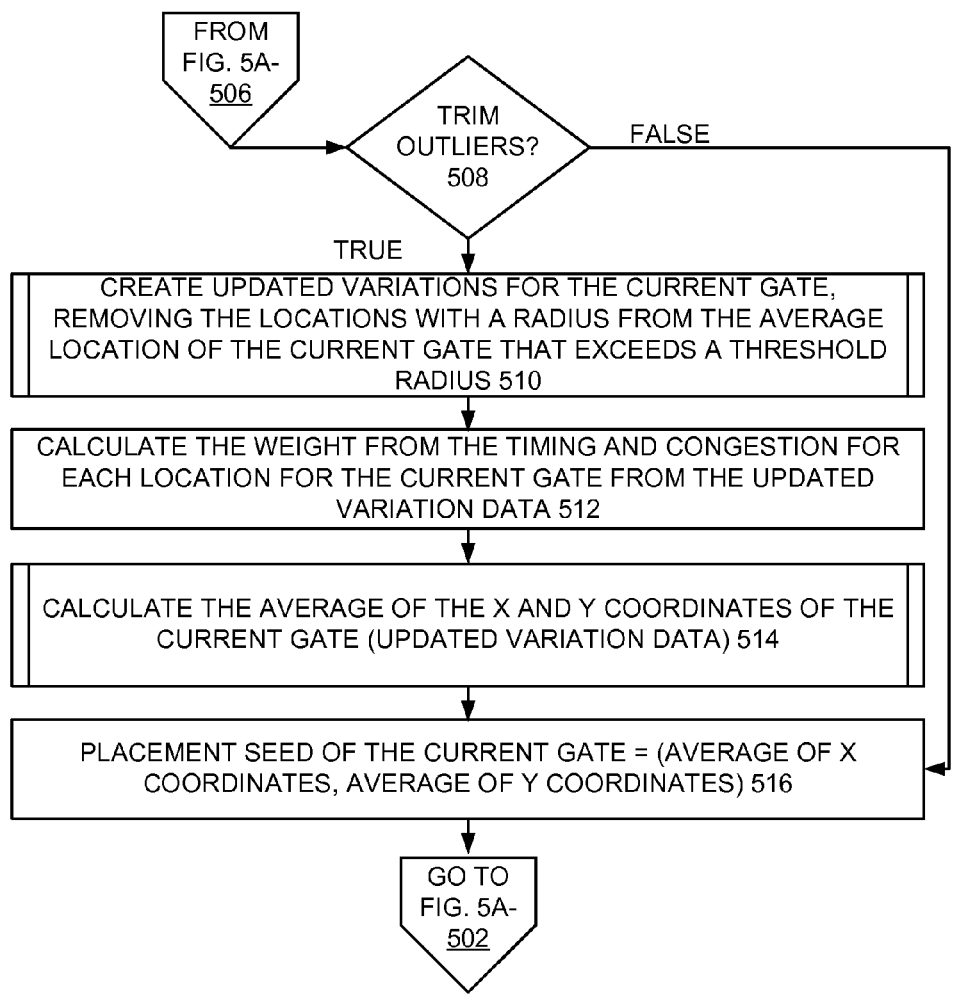

Referring now to FIGS. 5A and 5B, there are shown example operations for implementing enhanced physical design quality using historical placement analytics in accordance with the preferred embodiment starting at a block 500. As indicated in a decision block 502, for each gate in the variation data 140, a current gate is set to next gate and the weight is calculated from the timing and congestion for each location for the current gate from the variation data as indicated in a block 504. The average of the X and Y coordinates of the current gate is calculated to produce variation data as indicated in a block 506, for example as illustrated and described with respect to the flow chart of FIG. 6. Then operations continue as indicated in a decision block 508 in FIG. 5B.

In FIG. 5B, checking if trimming of outliers is desired is performed at decision block 508. When an outlier to trim is identified, updated variations for the current gate is created, removing the locations with a radius from the average location of the current gate that exceeds a threshold radius as indicated in a block 510, for example as illustrated and described with respect to the flow chart of FIG. 7. As indicated in a block 512, the weight from the current timing and congestion for each location for the current gate is calculated from the updated variation data. As indicated in a block 514, the average of the X and Y coordinates of the current gate is calculated for updated variation data, for example as illustrated and described with respect to the flow chart of FIG. 6. As indicated in a block 516 the placement seed 146 equals (average of X coordinates, average of Y coordinates).

Then operations continue as indicated at block 502 in FIG. 5A until all gates in the variation data are processed. Then the weighed average location and undesirable location of each gate ID in the placement seeds are used for creating the netlist 144, using absolute pre-placement, attractions, individual bounding box, grouped bounding box or inverse bounding box algorithms as indicated in a block 518. Then operations return as indicated in a block 520.

For example, using absolute pre-placement at block 518, the generated placement locations could seed a subsequent placement job to force the specified gates to the exact location.

For example, using attraction-based scheme at block 518, this approach would use existing EDA placement tool features to apply an attraction weight, where it may be obvious for some gates to reside in a certain location; these could be given a high attraction weight. However, the algorithm might not be as sure about other gates and they would be given a lower weight.

For example, using individual bounding box at block 518, this approach could provide a bounding box constraint to prevent the gate from leaving a specified bounding box, where this bounding box could simply be the rectangular form of the radius.

For example, using the grouped bounding box at block 518, this approach could determine if several gates have placement seeds in a similar location, where several gates are grouped and defined as a single bounding box which contains all the gates. This approach would likely be more efficient for the placement tool and may be more obvious to the designer versus a long list of individual constraints.

For example, using the inverse bounding box at block 518, this approach could constrain the placement tool to not place the gate or gates in the specific undesirable region or regions.

Figure 6:
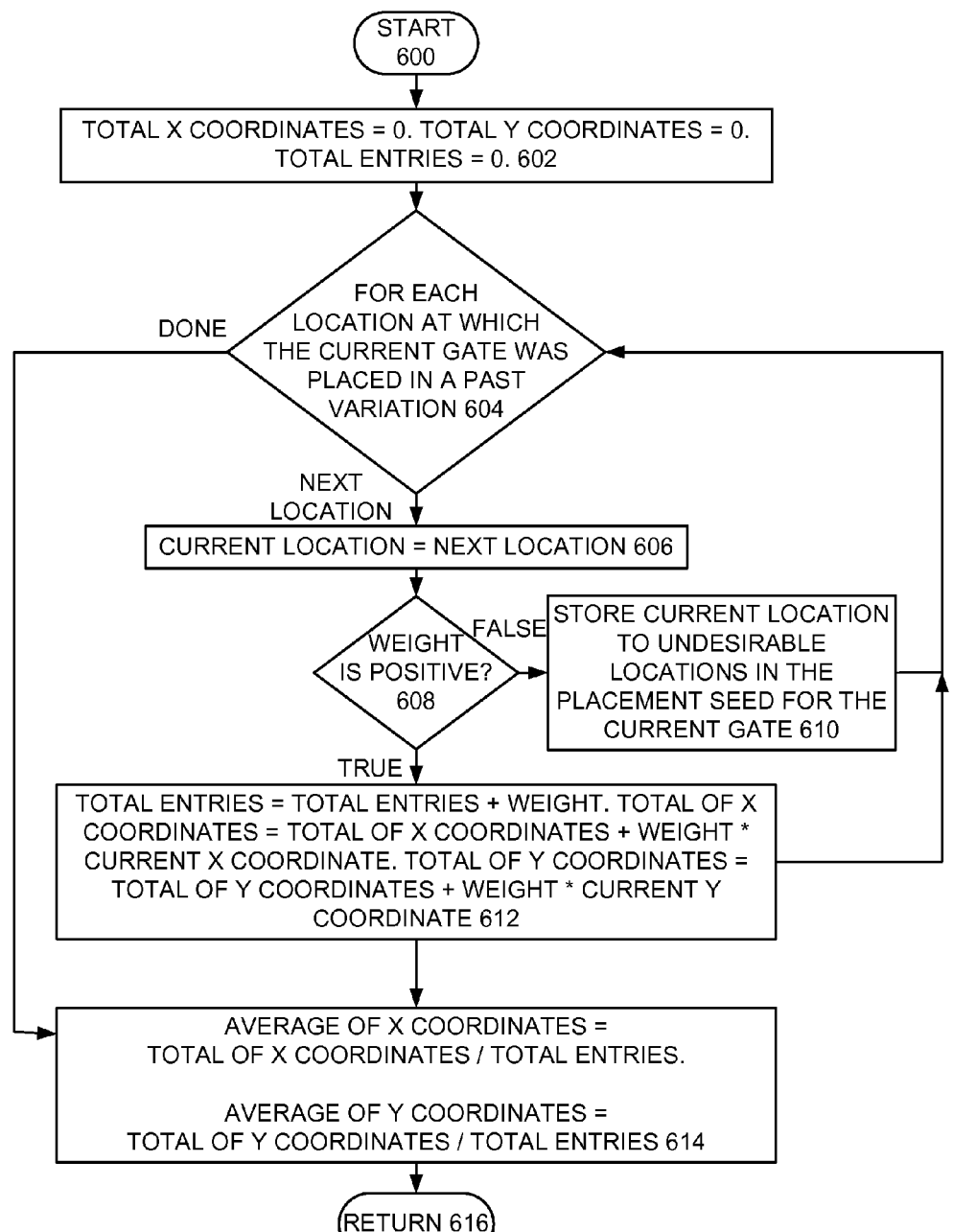

Referring now to FIG. 6, there are shown example operations for implementing enhanced physical design quality using historical placement analytics to produce variation data 140 in accordance with the preferred embodiment starting at a block 600. As indicated in a block 602, the total X coordinates, the total Y coordinates, and total entries equal 0. As indicated in a decision block 604, for each location at which the current gate was placed in a past variation data 140, a current location is set to next location as indicated in a block 606. Checking if weight is positive as indicated in a decision block 608. If weight is not positive, then the current location is stored to undesirable locations in the placement seed for the current gate as indicated in a block 610. If weight is positive, then the total entries is set to total entries+weight; total of X coordinates is set to total of X coordinates+weight*current X coordinate; and total of Y coordinates is set to total of Y coordinates+weight*current Y coordinate as indicated in a block 612. Then as indicated in a block 614, the average of X coordinates is calculated equal total of X coordinates/total entries; and the average of Y coordinates is calculated equal total of Y coordinates/total entries. Then operations return as indicated in a block 616.

Figure 7:
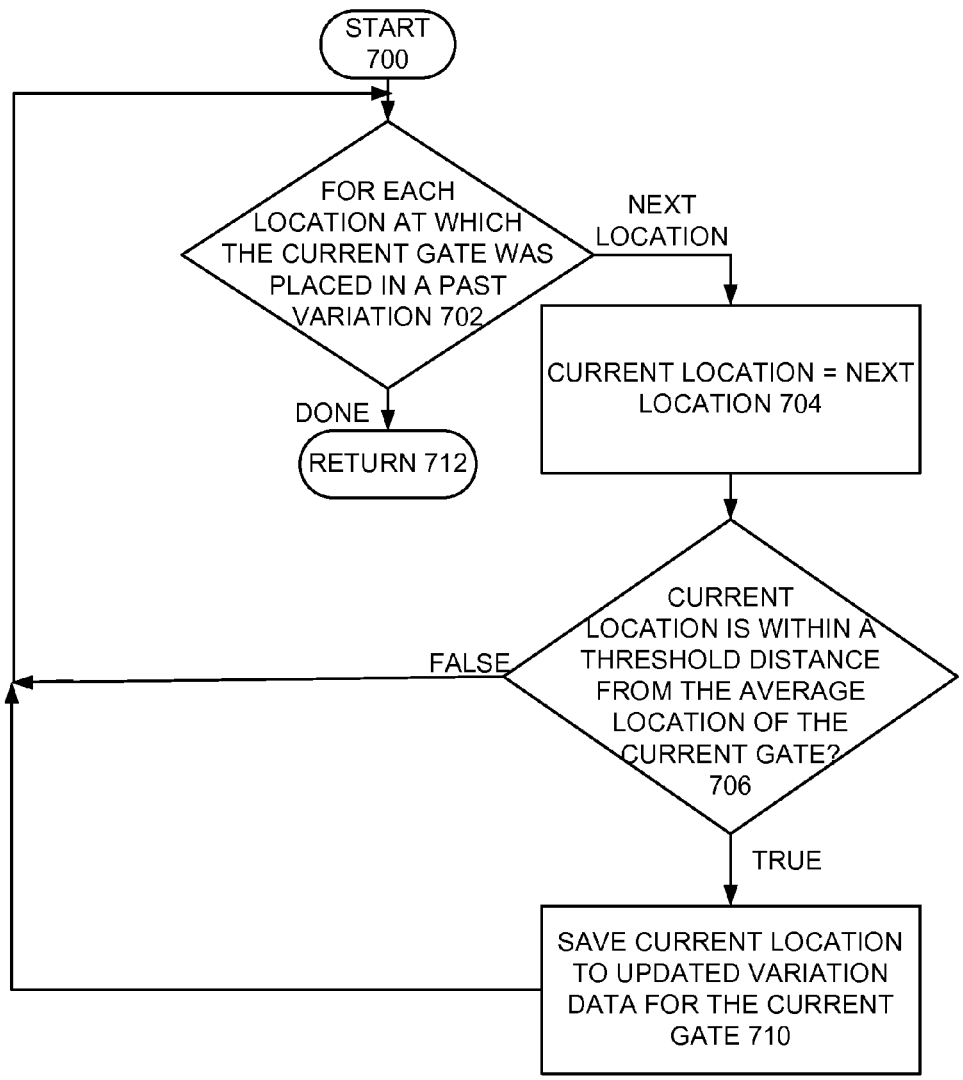

Referring now to FIG. 7, there are shown example operations for implementing enhanced physical design quality using historical placement analytics to produce updated variation data 142 in accordance with the preferred embodiment starting at a block 700. As indicated in a decision block 702, for every variation for the current gate, a current location is set to next location as indicated in a block 704. Checking if the current location is within a threshold distance from the average location of the current gate is performed as indicated in a decision block 706. If the current location is not within the threshold distance from the average location of the current gate, then operations return to decision block 702. If the current location is within the threshold distance from the average location of the current gate, then the current location is saved to the updated variation data for the current gate as indicated in a block 710 and operations return to decision block 702. After every variation location for the current gate is done, then operations return as indicated in a block 712.

In accordance with features of the invention, the implementations are not limited to the use of placement as the only input. The algorithm advantageously is further tuned to build a weighted average, for example, weighted geometric mean based on various metrics such as timing and congestion. For example, if a latch is in location x1, y1 with good timing then it is given a higher weight than the same latch placed at x2, y2 in another variation with bad timing. Similarly, in yet another variation, if the same latch at x3, y3 is in a highly congested region then the location may be given a lower weight than if the latch was in a less congested region. Other such metrics could be used to build a full weighted average. This approach could then apply a low weight to locations far away from the mean, assuming timing and congestion and other metrics are not better. Also, the algorithm could take into account designer-generated weights. For example, if the designer felt he knew where the latch could go he could apply a higher weight to his location, while still allowing the algorithm to produce the placement seed.

Figure 8:
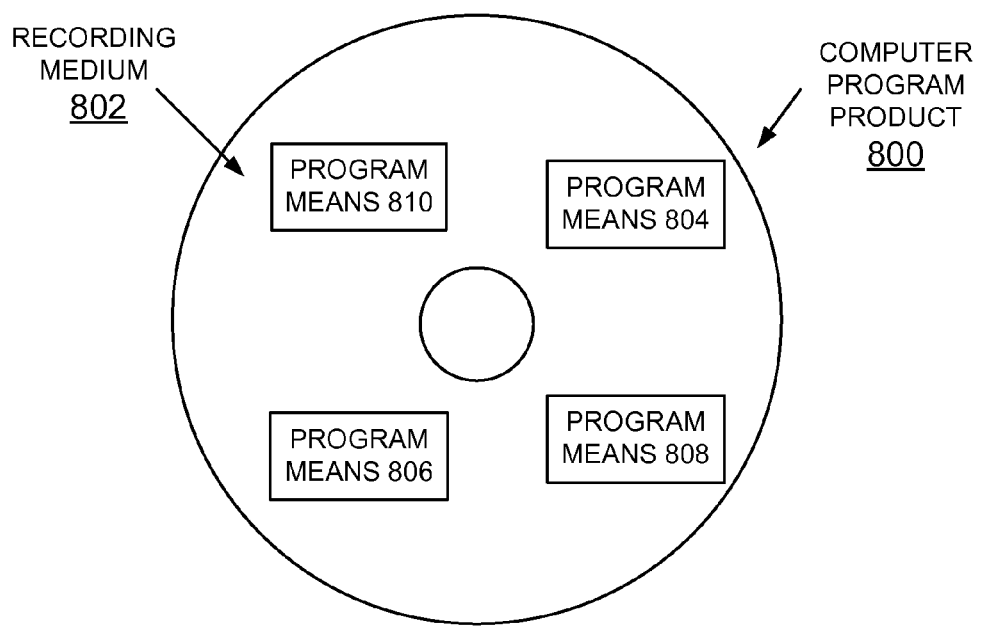
FIG. 8 is a block diagram illustrating a computer program product in accordance with the preferred embodiment.

Referring now to FIG. 8, an article of manufacture or a computer program product 800 of the invention is illustrated. The computer program product 800 is tangibly embodied on a non-transitory computer readable storage medium that includes a recording medium 802, such as, a floppy disk, a high capacity read only memory in the form of an optically read compact disk or CD-ROM, a tape, or another similar computer program product. Recording medium 802 stores program means 804, 806, 808, and 810 on the medium 802 for carrying out the methods for implementing enhanced physical design quality using historical placement analytics of the preferred embodiment in the system 100 of FIG. 1.

A sequence of program instructions or a logical assembly of one or more interrelated modules defined by the recorded program means 804, 808, 808, and 810, direct the system 100 for implementing enhanced physical design quality using historical placement analytics of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing enhanced physical design quality using historical placement analytics in a gate design in a computer system including a processor, a physical design tool tangibly embodied in a non-transitory machine readable medium used in implementing enhanced physical design quality, said processor using said physical design tool comprising the steps of:
performing mathematical data analysis to determine placement trends for subsequent physical design placement processes;
generating a placement seed used for a subsequent placement process;
performing the subsequent placement process for each gate including
calculating an average of X and Y coordinates, and removing outliers for a current gate by removing locations exceeding a predefined threshold radius, and
updating the placement seed to continue the subsequent placement process.

2. The method as recited in claim 1 wherein generating a placement seed used for a subsequent placement process includes identifying a weighted average location and any undesirable location for a gate or group of gates.

3. The method as recited in claim 2 wherein identifying a weighted average location and any undesirable location for a gate or group of gates includes eliminating outlier locations.

4. The method as recited in claim 2 wherein identifying a weighted average location and any undesirable location for a gate or group of gates includes identifying a weighted average location based upon one or more metrics including placement, timing and congestion.

5. The method as recited in claim 1 wherein performing mathematical data analysis includes determining variation data for a gate or group of gates.

6. The method as recited in claim 5 wherein determining variation data for a gate or group of gates includes identifying historical placement locations.

7. The method as recited in claim 6 further includes identifying a historical timing value.

8. The method as recited in claim 6 further includes identifying a historical congestion value.

9. The method as recited in claim 1 includes importing placement metrics and one or more other metrics from a plurality of variations of a design.

* * * * *